(12) United States Patent
Saito et al.

(10) Patent No.: US 9,601,408 B2
(45) Date of Patent: Mar. 21, 2017

(54) SEMICONDUCTOR DEVICE

(71) Applicants: Shoji Saito, Tokyo (JP); Khalid Hassan Hussein, Tokyo (JP); Arata Iizuka, Tokyo (JP)

(72) Inventors: Shoji Saito, Tokyo (JP); Khalid Hassan Hussein, Tokyo (JP); Arata Iizuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/423,513

(22) PCT Filed: Oct. 25, 2012

(86) PCT No.: PCT/JP2012/077626
§ 371 (c)(1),
(2) Date: Feb. 24, 2015

(87) PCT Pub. No.: WO2014/064806
PCT Pub. Date: May 1, 2014

(65) Prior Publication Data
US 2015/0340325 A1    Nov. 26, 2015

(51) Int. Cl.
*H01L 23/00*    (2006.01)
*H01L 23/433*    (2006.01)
(Continued)

(52) U.S. Cl.
CPC .......... *H01L 23/4334* (2013.01); *H01L 23/12* (2013.01); *H01L 23/28* (2013.01);
(Continued)

(58) Field of Classification Search
CPC .................................................. H01L 23/5225
See application file for complete search history.

(56) References Cited

U.S. PATENT DOCUMENTS 4,474,685 A * 10/1984 Annis ...................... H01B 1/22
                                                                  252/503
5,365,107 A    11/1994 Kuraishi et al.
(Continued)

FOREIGN PATENT DOCUMENTS

JP    H02-288357 A    11/1990
JP    H03-171652 A    7/1991
(Continued)

OTHER PUBLICATIONS

Notification of Transmittal of Copies of Translation of the International Preliminary Report on Patentability and Translation of Written Opinion of the International Searching Authority; PCT/JP2012/077626; issued on May 7, 2015.
(Continued)

*Primary Examiner* — William Harriston
(74) *Attorney, Agent, or Firm* — Studebaker & Brackett PC

(57) ABSTRACT

A semiconductor device of the present invention includes a semiconductor element having an upper surface and a lower surface, a metal plate thermally connected to the lower surface, an upper surface electrode soldered to the upper surface, an insulating sheet formed on the upper surface electrode so as to be in surface contact with the upper surface electrode, a shielding plate formed on the insulating sheet so as to be in surface contact with the insulating sheet, the shielding plate shielding against radiation noise, and a resin with which the semiconductor element is covered, while a portion of the upper surface electrode, a portion of the shielding plate and a lower surface of the metal plate are exposed to the outside, wherein the heat conductivity of the insulating sheet is higher than the heat conductivity of the resin.

7 Claims, 6 Drawing Sheets

(51) Int. Cl.
- *H01L 23/36* (2006.01)
- *H01L 23/29* (2006.01)
- *H01L 23/31* (2006.01)
- *H01L 23/12* (2006.01)
- *H01L 23/552* (2006.01)
- *H01L 23/28* (2006.01)
- *H01L 23/495* (2006.01)

(52) U.S. Cl.
CPC ........ *H01L 23/293* (2013.01); *H01L 23/3157* (2013.01); *H01L 23/36* (2013.01); *H01L 23/552* (2013.01); *H01L 24/33* (2013.01); H01L 23/3107 (2013.01); H01L 23/49562 (2013.01); H01L 23/49568 (2013.01); H01L 2224/48091 (2013.01); H01L 2224/48247 (2013.01); H01L 2224/73265 (2013.01); H01L 2924/13055 (2013.01); H01L 2924/13091 (2013.01); H01L 2924/181 (2013.01); H01L 2924/3025 (2013.01)

(56) References Cited

U.S. PATENT DOCUMENTS

| | | |
|---|---|---|
| 5,446,959 A | 9/1995 | Kim et al. |
| 2004/0180474 A1* | 9/2004 | Oman ................ H01L 21/563 438/125 |
| 2010/0065950 A1* | 3/2010 | Lowry ................ H01L 23/4334 257/675 |
| 2010/0327455 A1 | 12/2010 | Nishihata et al. |
| 2012/0001318 A1* | 1/2012 | Mamitsu ............ H01L 23/4334 257/713 |

FOREIGN PATENT DOCUMENTS

| | | |
|---|---|---|
| JP | H06-097321 A | 4/1994 |
| JP | H06-275741 A | 9/1994 |
| JP | H07-078900 A | 3/1995 |
| JP | 2895504 B2 | 5/1999 |
| JP | 2005-353805 A | 12/2005 |
| JP | 2011-029589 A | 2/2011 |
| JP | 2011-054610 A | 3/2011 |
| JP | 2012-004282 A | 1/2012 |
| JP | 2012-114455 A | 6/2012 |

OTHER PUBLICATIONS

International Search Report; PCT/JP2012/077626; Jan. 22, 2013.
An Office Action; "Notification of Reason for Rejection," issued by the Japanese Patent Office on Mar. 15, 2016, which corresponds to Japanese Patent Application No. 2014-543081 and is related to U.S. Appl. No. 14/423,513; with English language partial translation.
An Office Action issued by the Chinese Patent Office on Dec. 5, 2016, which corresponds to Chinese Patent Application No. 201280076656.0 and is related to U.S. Appl. No. 14/423,513; with English language partial translation.

* cited by examiner

SEMICONDUCTOR DEVICE

TECHNICAL FIELD

This invention relates to a semiconductor device used, for example, for switching of a large current.

BACKGROUND ART

Patent Literature 1 discloses a semiconductor device having an island and a semiconductor element bonded on the island, the island and the semiconductor element being encapsulated in a resin. In this semiconductor device, an electrically conductive layer having an electromagnetic wave shielding function is formed on a surface of the encapsulation resin or in the resin to reduce the influence of external electromagnetic wave noise. Further, the electrically conductive layer and the island are connected to each other to enable heat conduction between the electrically conductive layer and the island and dissipation of heat from the electrically conductive layer.

PRIOR ART

Patent Literature

Patent Literature 1: Japanese Patent Laid-Open No. H06-275741

SUMMARY OF INVENTION

Technical Problem

Radiation noise is generated from the semiconductor element that switches a large current. Radiation noise is thought to cause a malfunction in the operation of a control circuit driven at a power supply voltage of, for example, several volts to several ten bolts. It is, therefore, preferable to construct the semiconductor device so that the control circuit can be shielded from radiation noise.

On the other hand, there is a need to sufficiently consider improving the heat dissipation ability of the semiconductor device and reducing the size of the semiconductor device. That is, it is preferable to make the semiconductor device as smaller in size as possible while securing sufficiently heat dissipation ability of the resin-encapsulated semiconductor element and improving the reliability of the semiconductor element.

Heat dissipation from the lower surface of the semiconductor element is enabled by bringing the electrically conductive layer (shielding plate) for shielding against radiation noise into contact with the island as in the semiconductor device disclosed in Patent Literature 1. In some cases, however, the heat dissipation ability is insufficient if heat is dissipated from only one side of the semiconductor element as described above.

The present invention has been achieved to solve the above-described problem, and an object of the present invention is to provide a semiconductor device capable of reducing the influence of radiation noise to a control substrate and having high heat dissipation ability while being reduced in size.

Means for Solving the Problems

A semiconductor device according to the present invention includes a semiconductor element having an upper surface and a lower surface, a metal plate thermally connected to the lower surface, an upper surface electrode soldered to the upper surface, an insulating sheet formed on the upper surface electrode so as to be in surface contact with the upper surface electrode, a shielding plate formed on the insulating sheet so as to be in surface contact with the insulating sheet, the shielding plate shielding against radiation noise, and a resin with which the semiconductor element is covered, while a portion of the upper surface electrode, a portion of the shielding plate and a lower surface of the metal plate are exposed to the outside, wherein the heat conductivity of the insulating sheet is higher than the heat conductivity of the resin.

Other features of the present invention will be made clear below.

Advantageous Effects of Invention

According to the present invention, a heat release path on the upper surface side of the semiconductor element is secured by the shielding plate formed integrally with the resin, thus enabling the provision of the semiconductor device capable of reducing the influence of radiation noise to the control substrate and having high heat dissipation ability while being reduced in size.

DESCRIPTION OF EMBODIMENTS

Figure 1:
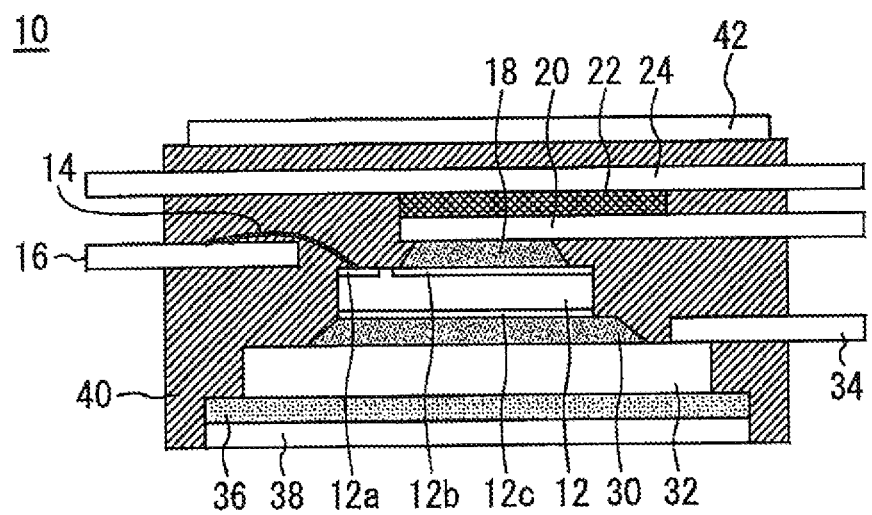
FIG. 1 is a sectional view of a semiconductor device according to Embodiment 1 of the present invention.

A semiconductor device according to an embodiment of the present invention will be described with reference to the drawings. Identical or corresponding components are indicated by the same reference characters and repeated description for them is avoided in some cases.

Embodiment 1

FIG. 1 is a sectional view of a semiconductor device according to Embodiment 1 of the present invention. A semiconductor device 10 is provided with a semiconductor element 12 formed with, for example, IGBT. The semiconductor element 12 has an upper surface and a lower surface. A gate 12a and an emitter 12b are formed on the upper surface. A collector 12c is formed on the lower surface.

One end of a wire 14 formed of Al or Cu for example is connected to the gate 12a of the semiconductor element 12. The other end of the wire 14 is connected to a control electrode 16. An upper surface electrode 20 (N-side electrode) is fixed on the emitter 12b on the upper surface of the semiconductor element 12 by solder 18. An insulating sheet 22 is formed on the upper surface electrode 20 so as to be in surface contact with the upper surface electrode 20. A shielding plate 24 is formed on the insulating sheet 22 so as to be in surface contact with the insulating sheet 22. The shielding plate 24 is formed of a material for shielding against radiation noise, e.g., Al, Cu, or graphite.

A heat sink 32 is fixed to the collector 12c on the lower surface of the semiconductor element 12 by solder 30. The heat sink 32 is formed of an electrically conductive material, e.g., Cu, Al, or an alloy consisting mainly of Cu. A lower surface electrode 34 (P-side electrode) is fixed to an upper surface of the heat sink 32, for example, by solder. On a lower surface of the heat sink 32, an insulating layer 36 is formed of a material having high heat conductivity. A metal plate 38 is fixed on a lower surface of the insulating layer 36. The metal plate 38 is formed of Cu for example. Thus, the collector 12c on the lower surface of the semiconductor element 12 and the metal plate 38 are thermally connected to each other.

The above-described components are covered with a resin 40. More specifically, the resin 40 covers the components including the semiconductor element 12, with a portion of the upper surface electrode 20, a portion of the shielding plate 24, a portion of the control electrode 16, a portion of the lower surface electrode 34 and lower surface of the metal plate 38 exposed to the outside.

The insulating sheet 22 and the resin 40 are formed of different materials. Materials for the insulating sheet 22 and the resin 40 are selected such that the heat conductivity of the insulating sheet 22 is higher than the heat conductivity of the resin 40. For example, for the insulating sheet 22, a material formed of an epoxy resin, a silicon resin or a polyimide resin impregnated with a filler such as alumina, boron nitride, silicon nitride or aluminum nitride is used to improve the heat conductivity. The content of the filler is, preferably, about 50 to 80% by volume. On the other hand, for example, an epoxy resin is used as resin 40.

As can be understood from FIG. 1, the insulating sheet 22 or the resin 40 exists between the shielding plate 24 and the upper surface electrode 20 and the shielding plate 24 and the upper surface electrode 20 are therefore insulated electrically from each other. As a result, the shielding plate 24 can be set to ground potential when connected to an external ground terminal.

Figure 2:
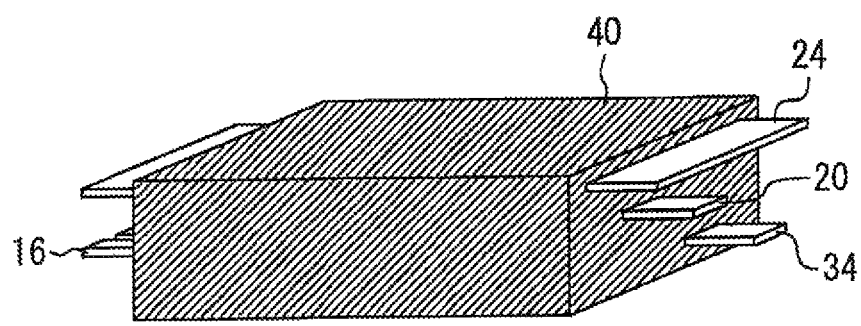
FIG. 2 is a perspective view of the resin and other components of the semiconductor device according to Embodiment 1 of the present invention.

FIG. 2 is a perspective view of the resin and other components of the semiconductor device according to Embodiment 1 of the present invention. The shielding plate 24 extends leftward and rightward from the resin 40. Referring back to FIG. 1, a control substrate 42 is fixed on the resin 40 while being positioned above the shielding plate 24. A control circuit is formed on the control substrate 42. For fixing between the control substrate 42 and the resin 40, screws or an adhesive for example is used. The control substrate 42 transmits a gate drive signal to the gate 12a. A ground terminal on the control substrate 42 and the shielding plate 24 may be electrically connected to each other to set the shielding plate 24 to ground potential.

For example, forming the shielding plate 24 outside the resin 40 requires fixing means for fixing the shielding plate 24 to the resin 40. An assembly process is also required. However, in the semiconductor device according to Embodiment 1 of the present invention, the shielding plate 24 and the resin 40 are formed integrally with each other, thereby eliminating the need for the fixing means for fixing the shielding plate 24 to the resin 40 and the assembly process. Further, in the case where the shielding plate 24 and the resin 40 are formed integrally with each other, the semiconductor device can be reduced in size in comparison with a case where the shielding plate 24 is provided outside the resin 40. Also, fixing the control substrate 42 on the resin 40 ensures that the space for provision of the control substrate 42 can be reduced.

Heat in the semiconductor element 12 of the semiconductor device 10 according to Embodiment 1 of the present invention can be dissipated both from the lower surface and from the upper surface. That is, heat from the lower surface is dissipated through the metal plate 38, while heat from the upper surface is transferred through the solder 18, the upper surface electrode 20 and the insulating sheet 22 and dissipated through the shielding plate 24. The provision of the insulating sheet 22 having heat conductivity higher than that of the resin 40 in the heat path from the upper surface to the shielding plate 24 ensures that heat from the upper surface of the semiconductor element 12 can be rapidly released to the outside. Accordingly, the shielding plate 24 has a function to dissipate heat from the upper surface of the semiconductor element 12 as well as the function of shielding against radiation noise. Embodiment 1 of the present invention thus can provide a semiconductor device reduced in size, capable of reducing the influence of radiation noise on the control substrate 42 and having high heat dissipation ability.

If the thickness of the shielding plate 24 is increased, the shielding function and the heat dissipation function can be improved. It is, therefore, preferable that the shielding plate 24 be made with an appropriate thickness. The shielding plate 24 may be connected to a terminal other than the ground terminal on the control substrate 42 if the shielding plate 24 can be set to ground potential. The semiconductor element 12 is not limited to the IGBT. Any other element, such as a MOSFET or a freewheel diode, having an upper surface electrode and a lower surface electrode may suffice as semiconductor element 12. The heat sink 32 and the lower surface electrode 34 may be formed integrally with each other. These modifications can also be applied to semiconductor devices according to embodiments described below.

Embodiment 2

Figure 3:
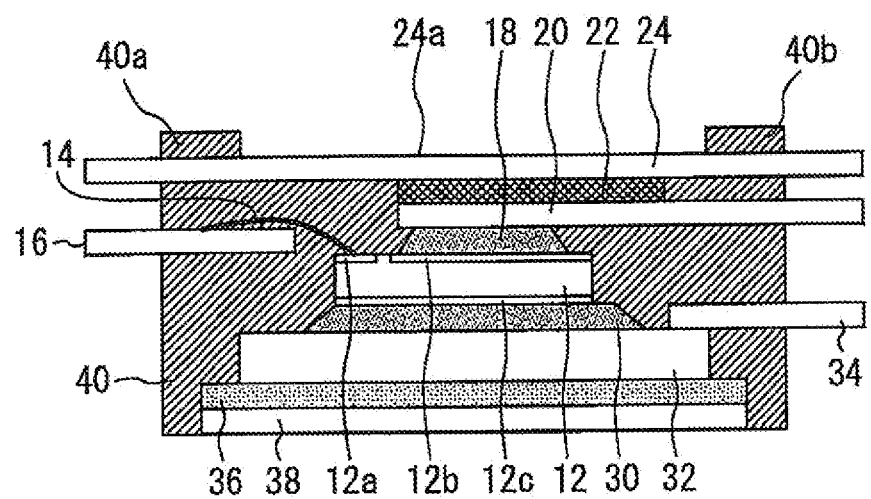
FIG. 3 is a sectional view of the semiconductor device according to Embodiment 2 of the present invention.

A semiconductor device according to Embodiment 2 of the present invention corresponds in many respects to the semiconductor device according to Embodiment 1 and will therefore be described mainly with respect to points of difference from the semiconductor device according to Embodiment 1. FIG. 3 is a sectional view of the semiconductor device according to Embodiment 2 of the present invention. This semiconductor device is characterized by exposing the shielding plate 24 out of the resin 40 right above the semiconductor element 12. The illustration of the control substrate is omitted in FIG. 3 and other subsequent sectional views.

Figure 4:
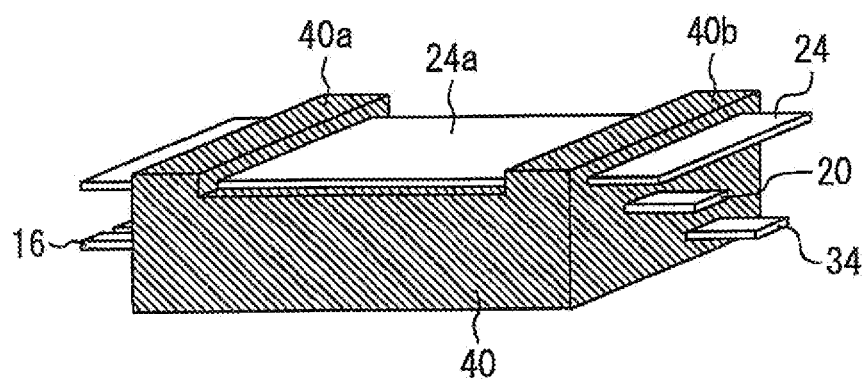
FIG. 4 is a perspective view of the resin and other components of the semiconductor device according to Embodiment 2 of the present invention.

A central portion 24a of the shielding plate 24 is positioned right above the semiconductor element 12 and is exposed out of the resin 40. Resins 40a and 40b are formed on the shielding plate 24 by avoiding the central portion 24a. FIG. 4 is a perspective view of the resin and other components of the semiconductor device according to Embodiment 2 of the present invention. The resin 40 has such a shape that the resins 40a and 40b above the shielding plate 24 and the resin below the shielding plate 24 are formed integrally with each other. The resin 40 thus surrounds portions of the shielding plate 24 to fix the shielding plate 24.

In the semiconductor device according to Embodiment 2 of the present invention, the central portion 24a is exposed out of the resin 40, so that the area of exposure of the shielding plate 24 can be increased relative to that in Embodiment 1. The heat dissipation ability of the semiconductor device can therefore be improved. Moreover, heat from the upper surface of the semiconductor element 12 can be dissipated through the shortest path since the central portion 24a is right above the semiconductor element 12.

Embodiment 3

Figure 5:
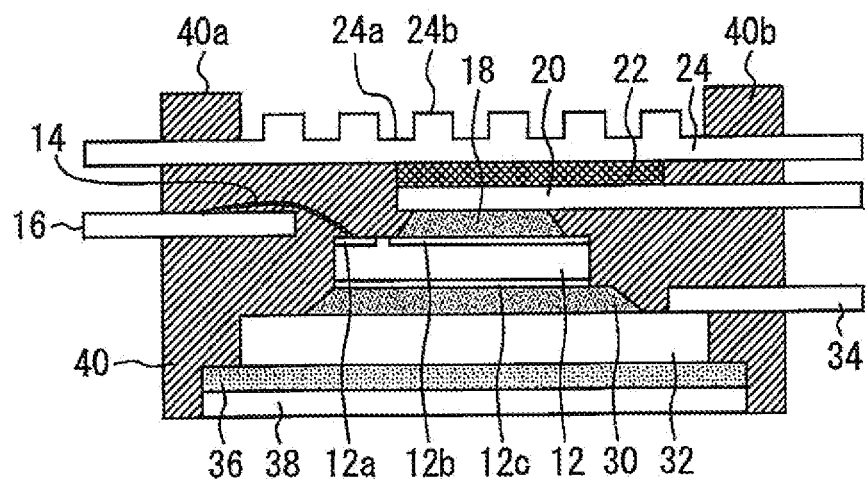
FIG. 5 is a sectional view of the semiconductor device according to Embodiment 3 of the present invention.

A semiconductor device according to Embodiment 3 of the present invention corresponds in many respects to the semiconductor device according to Embodiment 2 and will therefore be described mainly with respect to points of difference from the semiconductor device according to Embodiment 2. FIG. 5 is a sectional view of the semiconductor device according to Embodiment 3 of the present invention. This semiconductor device is characterized by forming projections 24b on the portion of the shielding plate 24 exposed out of the resin 40.

Figure 6:
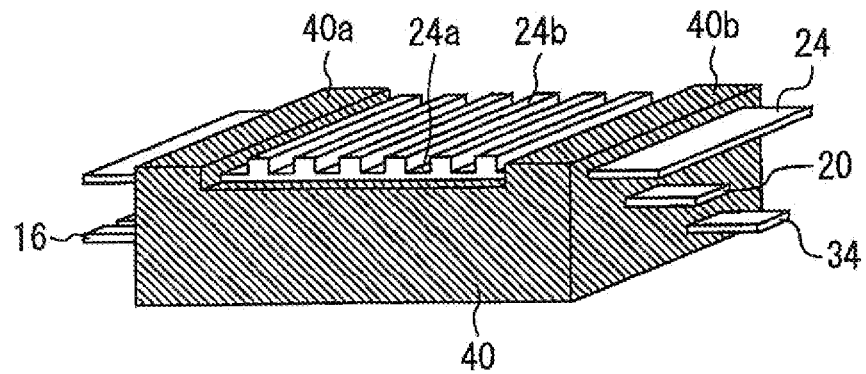
FIG. 6 is a perspective view of the resin and other components of the semiconductor device according to Embodiment 3 of the present invention.

FIG. 6 is a perspective view of the resin and other components of the semiconductor device according to Embodiment 3 of the present invention. A plurality of projections 24b are formed, each extending on and parallel to the central portion 24a. In the semiconductor device according to Embodiment 3 of the present invention, the projections 24b are provided on the portion of the shielding plate 24 exposed out of the resin, so that the surface area of the shielding plate 24 can be increased. The heat dissipation ability of the semiconductor device can therefore be improved.

While the projections 24b are formed on the central portion 24a in Embodiment 3 of the present invention, the heat dissipation ability of the semiconductor device can be improved if projections are formed on any portion of the shielding plate 24 exposed out of the resin 40. For example, projections may be formed on the portions of the shielding plate 24 extending outward from side surfaces of the resin 40.

Embodiment 4

Figure 7:
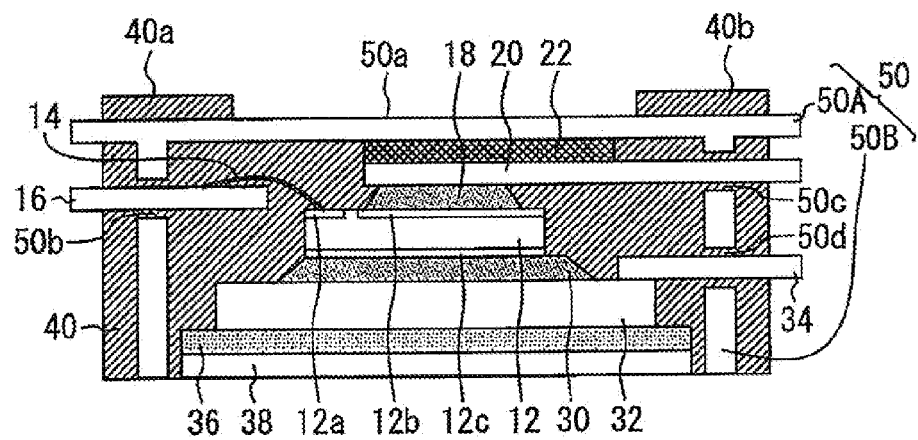
FIG. 7 is a sectional view of the semiconductor device according to Embodiment 4 of the present invention.

A semiconductor device according to Embodiment 4 of the present invention corresponds in many respects to the semiconductor device according to Embodiment 1 and will therefore be described mainly with respect to points of difference from the semiconductor device according to Embodiment 1. FIG. 7 is a sectional view of the semiconductor device according to Embodiment 4 of the present invention. This semiconductor device is characterized by surrounding side surfaces of the semiconductor element with a shielding plate 50.

The shielding plate 50 has a ceiling part 50A and a first surround part 50B connected to the ceiling part 50A. The ceiling part 50A is a part to be in contact with the insulating sheet 22. The ceiling part 50A has the same shape as that of the shielding plate 24 in Embodiment 1 of the present invention. A central portion 50a of the ceiling part 50A is exposed out of the resin 40. The first surround part 50B is a part formed so as to surround side surfaces of the semiconductor element 12.

The first surround part 50B has openings formed as slots 50b, 50c and 50d. The control electrode 16 is passed through the slot 50b and extends outward from the resin 40; the upper surface electrode 20 is passed through the slot 50c and extends outward from the resin 40; and the lower surface electrode 34 is passed through the slot 50d and extends outward from the resin 40. Contact of the shielding plate 50 with the control electrode 16, the upper surface electrode 20 or the lower surface electrode 34 is avoided by providing the slots 50b, 50c, or 50d. It is preferable to set the sizes of the slots 50b, 50c, or 50d so that the first surround part 50B has no electrical influence on the control electrode 16, the upper surface electrode 20 or the lower surface electrode 34.

Figure 8:
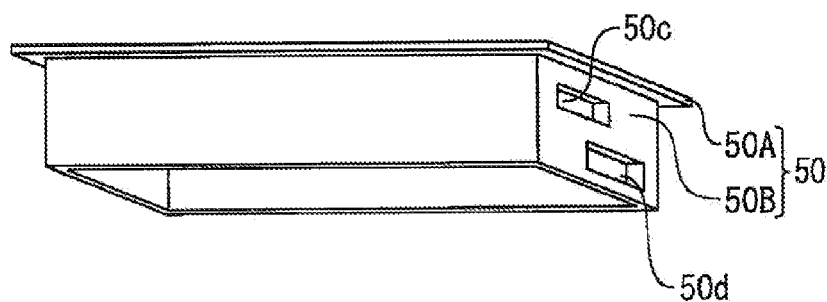
FIG. 8 is a perspective view of a shielding plate according to Embodiment 4 of the present invention.

FIG. 8 is a perspective view of a shielding plate according to Embodiment 4 of the present invention. The shielding plate 50 has such a shape as to be capable of covering the upper and side surfaces of the semiconductor element. That is, the shielding plate 50 is formed into the shape of a case having one open side.

Figure 9:
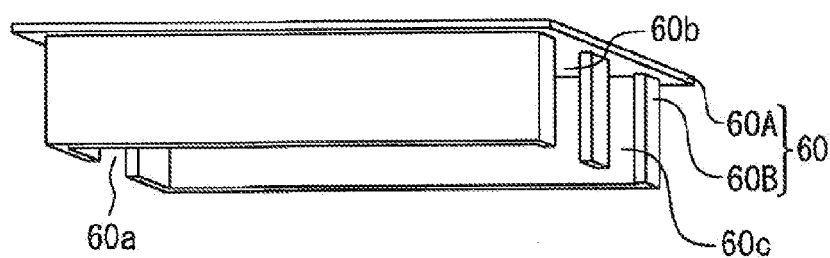
FIG. 9 is a perspective view showing an example of a modification of the shielding plate.

In the semiconductor device according to Embodiment 4 of the present invention, the shielding plate 50 is formed so as to surround the semiconductor element 12 acting as a radiation noise generation source, so that the shielding function can be improved. FIG. 9 is a perspective view showing an example of a modification of the shielding plate. FIG. 9 illustrates a shielding plate 60 having a ceiling part 60A and a first surround part 60B. Cuts are formed in the first surround part 60B, thereby forming slots 60a, 60b, and 60c. The slots 60a, 60b, and 60c can be increased in size by forming the cuts. Insulation can therefore be secured easily between the first surround part 60B and the control electrode 16, the upper surface electrode 20 or the lower surface electrode 34.

Embodiment 5

Figure 10:
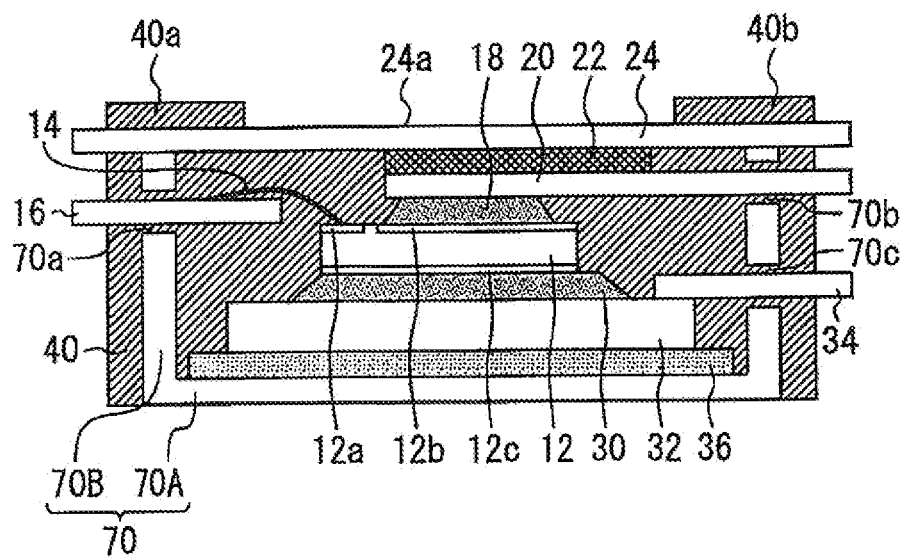
FIG. 10 is a sectional view of the semiconductor device according to Embodiment 5 of the present invention.

A semiconductor device according to Embodiment 5 of the present invention corresponds in many respects to the semiconductor device according to Embodiment 1 and will therefore be described mainly with respect to points of difference from the semiconductor device according to Embodiment 1. FIG. 10 is a sectional view of the semiconductor device according to Embodiment 5 of the present invention. This semiconductor device is characterized by surrounding side surfaces of the semiconductor element 12 with a metal plate 70.

The metal plate 70 has a bottom plate part 70A and a second surround part 70B connected to the bottom plate part 70A. The bottom plate part 70A is a part having an upper surface in contact with the insulating layer 36 and a lower surface exposed out of the resin 40. The second surround part 70B is a part formed so as to surround side surfaces of the semiconductor element 12. The side of the shielding plate 24 in surface contact with the insulating sheet 22 is in contact with an upper surface of the second surround part 70B.

The second surround part 70B has openings formed as slots 70a, 70b and 70c. The control electrode 16 is passed through the slot 70a and extends outward from the resin 40; the upper surface electrode 20 is passed through the slot 70b and extends outward from the resin 40; and the lower surface electrode 34 is passed through the slot 70*c* and extends outward from the resin 40. Contact of the metal plate 70 with the control electrode 16, the upper surface electrode 20 or the lower surface electrode 34 is avoided by providing the slots 70*a*, 70*b*, or 70*c*. It is preferable to set the sizes of the slots 70*a*, 70*b*, or 70*c* so that the second surround part 70B has no electrical influence on the control electrode 16, the upper surface electrode 20 or the lower surface electrode 34.

Figure 11:
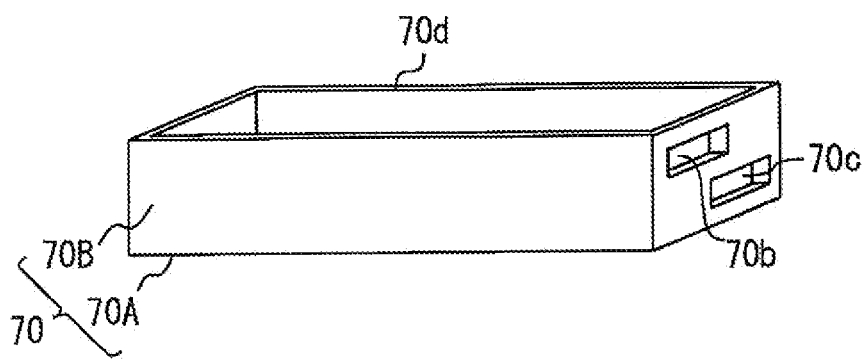
FIG. 11 is a perspective view of the metal plate according to Embodiment 5 of the present invention.

FIG. 11 is a perspective view of the metal plate according to Embodiment 5 of the present invention. The metal plate 70 has such a shape as to be capable of covering the lower and side surfaces of the semiconductor element. That is, the metal plate 70 is formed into the shape of a case having one open side.

In the semiconductor device according to Embodiment 5 of the present invention, the upper surface of the semiconductor element 12 is covered with the shielding plate 24, while the lower and side surfaces of the semiconductor element 12 are covered with the metal plate 70. The shielding plate 24 and the metal plate 70 are connected to each other and can therefore be set collectively to ground potential. The function of shielding against radiation noise can therefore be improved.

Figure 12:
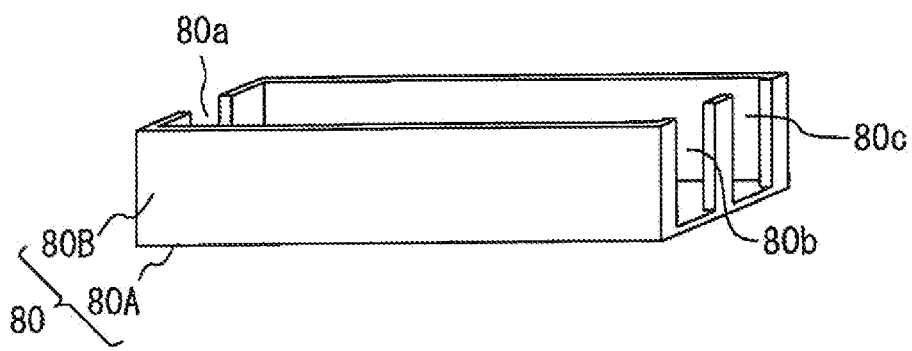
FIG. 12 is a perspective view showing an example of a modification of the metal plate.

FIG. 12 is a perspective view showing an example of a modification of the metal plate. A metal plate 80 has a bottom plate part 80A and a second surround part 80B. Cuts are formed in the second surround part 80B, thereby forming slots 80*a*, 80*b*, and 80*c*. Since the slots can be formed in increased sizes in this case, insulation can be secured easily between the second surround part 80B and the control electrode 16, the upper surface electrode 20 or the lower surface electrode 34.

Embodiment 6

Figure 13:
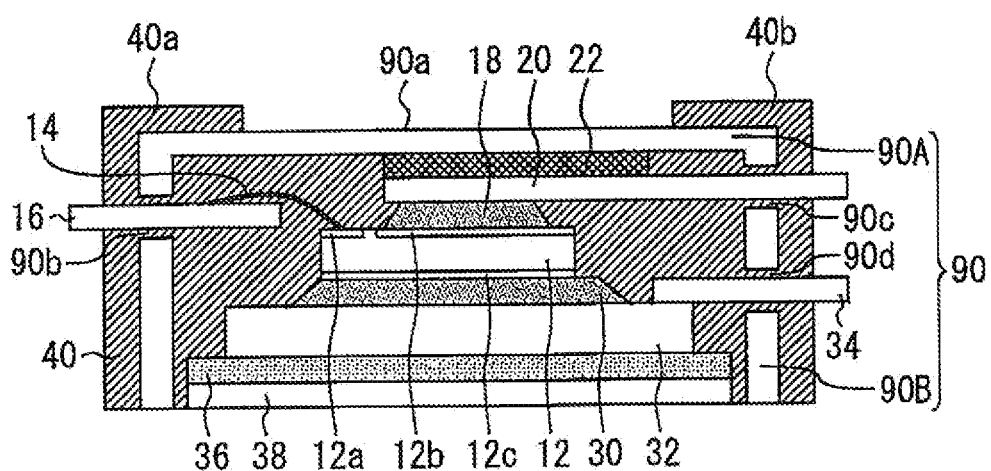
FIG. 13 is a sectional view of the semiconductor device according to Embodiment 6 of the present invention.

A semiconductor device according to Embodiment 6 of the present invention corresponds in many respects to the semiconductor device according to Embodiment 4 and will therefore be described mainly with respect to points of difference from the semiconductor device according to Embodiment 4. FIG. 13 is a sectional view of the semiconductor device according to Embodiment 6 of the present invention. This semiconductor device is characterized by forming a shielding plate 90 of a resin containing an added electrically conductive metal.

The shielding plate 90 has a ceiling plate part 90A and a first surround part 90B. The first surround part 90B has openings formed as slots 90*b*, 90*c*, and 90*d*. The shielding plate 90 is formed of a resin containing an added electrically conductive metal.

The semiconductor device thus constructed can be formed, for example, by performing three transfer molding steps. In the first transfer molding step, the resin 40 in the vicinity of the semiconductor element 12 is formed. In the second transfer molding step, the shielding plate 90 is formed. In the third transfer molding step, the resin 40 is formed outside the shielding plate 90.

The semiconductor device according to Embodiment 6 of the present invention requires no shielding plate formed of metal and can therefore be reduced in size.

DESCRIPTION OF SYMBOLS

10 semiconductor device, 12 semiconductor element, 12*a* gate, 12*b* emitter, 12*c* collector, 14 wire, 16 control electrode, 18 solder, 20 upper surface electrode, 22 insulating sheet, 24 shield plate, 24*a* central portion, 24*b* projections, 30 solder, 32 heat sink, 34 lower surface electrode, 36 insulating layer, 38 metal plate, 40,40*a*,40*b* resin, 42 control substrate, 50,60 shielding plate, 50A,60A ceiling part, 50B, 60B first surround part, 70,80 metal plate, 70A,80A bottom plate, 70B,80B second surround part, 90 shielding plate, 90A ceiling plate part, 90B first surround part

The invention claimed is:

1. A semiconductor device comprising:
    a semiconductor element having an upper surface and a lower surface;
    a metal plate thermally connected to the lower surface;
    an upper surface electrode soldered to the upper surface;
    an insulating sheet formed on the upper surface electrode so as to be in surface contact with the upper surface electrode;
    a shielding plate formed on the insulating sheet so as to be in surface contact with the insulating sheet, the shielding plate shielding against radiation noise; and
    a resin with which the semiconductor element is covered, while a portion of the upper surface electrode, a lateral portion of the shielding plate and a lower surface of the metal plate are exposed to the outside of the semiconductor device,
    wherein the heat conductivity of the insulating sheet is higher than the heat conductivity of the resin.

2. The semiconductor device according to claim 1, wherein the shielding plate is exposed from the resin to the outside right above the semiconductor element.

3. The semiconductor device according to claim 1, wherein a projection is formed on a portion of the shielding plate exposed from the resin to the outside.

4. The semiconductor device according to claim 1, wherein the shielding plate is formed of a resin containing an added electrically conductive metal.

5. A semiconductor device comprising:
    a semiconductor element having an upper surface and a lower surface;
    a metal plate thermally connected to the lower surface;
    an upper surface electrode soldered to the upper surface;
    an insulating sheet formed on the upper surface electrode so as to be in surface contact with the upper surface electrode;
    a shielding plate formed on the insulating sheet so as to be in surface contact with the insulating sheet, the shielding plate shielding against radiation noise; and
    a resin with which the semiconductor element is covered, while a portion of the upper surface electrode, a portion of the shielding plate and a lower surface of the metal plate are exposed to the outside,
    wherein the heat conductivity of the insulating sheet is higher than the heat conductivity of the resin, and
    wherein the shielding plate has:
    a ceiling part in contact with the insulating sheet; and
    a first surround part connected to the ceiling part, surrounding side surfaces of the semiconductor element, and having a slot for passage of the upper surface electrode.

6. A semiconductor device comprising:
    a semiconductor element having an upper surface and a lower surface;
    a metal plate thermally connected to the lower surface;
    an upper surface electrode soldered to the upper surface;
    an insulating sheet formed on the upper surface electrode so as to be in surface contact with the upper surface electrode;

a shielding plate formed on the insulating sheet so as to be in surface contact with the insulating sheet, the shielding plate shielding against radiation noise; and a resin with which the semiconductor element is covered, while a portion of the upper surface electrode, a portion of the shielding plate and a lower surface of the metal plate are exposed to the outside, wherein the heat conductivity of the insulating sheet is higher than the heat conductivity of the resin, and wherein the metal plate has:

a bottom plate part having a lower surface exposed out of the resin; and a second surround part connected to the bottom plate part, surrounding side surfaces of the semiconductor element, and having a slot for passage of the upper surface electrode, and wherein the side of the shielding plate in surface contact with the insulating sheet is in contact with an upper surface of the second surround part.

7. A semiconductor device comprising:

a semiconductor element having an upper surface and a lower surface;

a metal plate thermally connected to the lower surface;

an upper surface electrode soldered to the upper surface;

an insulating sheet formed on the upper surface electrode so as to be in surface contact with the upper surface electrode;

a shielding plate formed on the insulating sheet so as to be in surface contact with the insulating sheet, the shielding plate shielding against radiation noise;

a resin with which the semiconductor element is covered, while a portion of the upper surface electrode, a portion of the shielding plate and a lower surface of the metal plate are exposed to the outside of the semiconductor device; and a control substrate fixed on the resin while being positioned above the shielding plate, wherein the heat conductivity of the insulating sheet is higher than the heat conductivity of the resin.

* * * * *